United States Patent
Moriceau et al.

(10) Patent No.: US 7,435,690 B2
(45) Date of Patent: Oct. 14, 2008

(54) METHOD OF PREPARING A SILICON DIOXIDE LAYER BY HIGH TEMPERATURE OXIDATION ON A SUBSTRATE HAVING, AT LEAST ON THE SURFACE, GERMANIUM OR A SILICON-GERMANIUM ALLOY

(75) Inventors: Hubert Moriceau, Saint Egreve (FR); Pierre Mur, Crolles (FR)

(73) Assignee: Commissariat a l'Energie Atomique, Paris (FR)

( * ) Notice: Subject to any disclaimer, the term of this patent is extended or adjusted under 35 U.S.C. 154(b) by 361 days.

(21) Appl. No.: 11/090,426

(22) Filed: Mar. 25, 2005

(65) Prior Publication Data

US 2005/0215071 A1    Sep. 29, 2005

(30) Foreign Application Priority Data

Mar. 25, 2004    (FR) ................................. 04 50590

(51) Int. Cl.
*H01L 21/31* (2006.01)

(52) U.S. Cl. .................... 438/770; 438/773; 438/787

(58) Field of Classification Search ............... 438/770, 438/773, 787
See application file for complete search history.

(56) References Cited

U.S. PATENT DOCUMENTS

| | | | |
|---|---|---|---|
| 6,350,993 B1 * | 2/2002 | Chu et al. .................. 257/19 |
| 6,727,550 B2 * | 4/2004 | Tezuka et al. ............... 257/347 |
| 7,022,593 B2 * | 4/2006 | Arena et al. ................. 438/494 |
| 2005/0098234 A1 * | 5/2005 | Nakaharai et al. .......... 148/33.3 |
| 2007/0023066 A1 * | 2/2007 | Yokokawa et al. .......... 134/1.3 |

* cited by examiner

*Primary Examiner*—Carl Whitehead, Jr.
*Assistant Examiner*—Colleen E Rodgers
(74) *Attorney, Agent, or Firm*—McKenna Long Aldridge LLP

(57) ABSTRACT

Method of preparing a silicon dioxide layer by high-temperature oxidation on a substrate of formula $Si_{1-x}Ge_x$ in which x is greater than 0 and less than or equal to 1, the said method comprising the following successive steps:

a) at least one additional layer of thickness $h_y$ and of overall formula $Si_{1-y}Ge_y$, in which y is greater than 0 and less than x, is deposited on the said substrate of formula $Si_{1-x}Ge_x$; and b) the high-temperature oxidation of the said additional layer of overall formula $Si_{1-y}Ge_y$ is carried out, whereby the said additional layer is completely or partly converted into a layer of silicon oxide $SiO_2$.

Method of preparing an optical or electronic component, comprising at least one step for preparing an $SiO_2$ layer using the method described above.

16 Claims, 4 Drawing Sheets

METHOD OF PREPARING A SILICON DIOXIDE LAYER BY HIGH TEMPERATURE OXIDATION ON A SUBSTRATE HAVING, AT LEAST ON THE SURFACE, GERMANIUM OR A SILICON-GERMANIUM ALLOY

TECHNICAL FIELD

This application claims priority under the provisions of 35 U.S.C. §119 to French Application No. 04 50590, filed on Mar. 25, 2004, which is incorporated herein by reference in its entirety.

The invention relates to a method of preparing a silicon oxide layer or film by high-temperature oxidation (thermal silica) on a substrate having, at least on the surface, germanium or a silicon-germanium alloy and more particularly on a germanium or silicon-germanium alloy substrate.

The oxidation of germanium and silicon-germanium alloys, satisfying the formula $Ge_xSi_{1-x}$ with $x>0$ and $x\leq 1$, has become increasingly important in recent years.

This is because germanium and GeSi alloys have advantageous electronic and optical properties and provide heterostructures, especially for various silicon-based semiconductor devices.

Now, for technologies involving germanium or SiGe alloys, the properties of the oxide formed by this material are critical.

The technical field of the invention may thus in general be defined as that of the oxidation, more precisely the high-temperature oxidation, namely typically above 400° C., of Ge or SiGe so as to produce an oxide film on the surface of the said Ge or SiGe.

Conventional silicon oxidation methods have been tried for oxidizing $Si_{1-x}Ge_x$ alloys. In general dry oxidation methods are distinguished from wet oxidation methods that employ steam. These methods have been tried within wide temperature ranges, up to 500° C., and the oxidation has been studied as a function of the high-temperature treatment time and as regards the rate of oxidation obtained.

The general article by L. S. Riley and S. Hall, Journal of Applied Physics, Volume 85, No. 9, 1 May 1999, pp. 6828-6837 provides quite an exhaustive review of $Si_{1-x}Ge_x$ oxidation methods (see Table I of the said document).

In most of these methods, undesirable segregation of the germanium is observed when the treatment is carried out at a temperature of more than 500° C.

Moreover, the document by W. S. Liu et al., J. Appl. Phys. 71(7), 1 Apr. 1992, pp. 3626-3627 describes the wet thermal oxidation at 1000° C. of an epitaxial $Ge_{0.36}Si_{0.64}$ layer 470 nm in thickness on (100) Si and shows that the method produces oxides of various compositions depending on the conditions in the oxidation method.

Thus, when a specimen that has not been preheated is directly exposed to hot steam, the surface layer contains both Ge and Si, whereas only $SiO_2$ forms if a preheated specimen is exposed to hot steam, with an increased concentration of germanium in the oxidation front. Such effects are not present when dry oxidation is carried out.

The document by W. S. Liu et al., J. Appl. Phys. 71(8), 15 Apr. 1992, describes the wet oxidation of GeSi (500 nm thick layers of $Ge_{0.36}Si_{0.64}$ and $Ge_{0.28}Si_{0.72}$ on (100) Si at 700° C. A uniform $Ge_xSi_{1-x}O_2$ oxide layer forms with a smooth interface with the subjacent $Ge_xSi_{1-x}$ layer.

The oxidation of SiGe is only partial oxidation, germanium is therefore uniformly present in the oxide formed, the latter being a "mixed" $Si_{1-x}Ge_xO_2$ and not $SiO_2$, which is the desired oxide in the present case.

The same authors W. S. Liu et al., studied, in the document J. Appl. Phys. 72(9), 1 Nov. 1992, pp. 4444-4446 the oxide formed by partial oxidation in the previous document and showed that it is unstable when undergoing annealing treatments at 900° C. for 3 hours, when being aged in air at room temperature for 5 months, and when immersed in water.

Document US-B1-6 352 942 relates to a method of preparing a silicon dioxide layer of high quality on a germanium layer, in which method a silicon layer is deposited on the germanium layer and then this layer is oxidized to give an $SiO_2$ layer.

The oxidation of the silicon layer may be carried out dry, that is to say by exposing the Si layer to dry gaseous oxygen at a temperature of at least 500° C., preferably under pressure, or wet by exposing the Si layer to steam at a temperature of at least 500° C., preferably under pressure.

The technique described in document US-B1-6 352 942 requires the oxidation to be stopped in a carefully controlled manner.

Moreover, if the Si layer is grown epitaxially, it may be very thin, given the difference in lattice parameter that exists between Si and Ge.

If on the contrary the Si layer is deposited in the form of amorphous or polycrystalline Si, it is then difficult to control the quality of the interface with the Ge.

In addition, with this technique there is uncontrolled diffusion of the Ge into the Si.

On studying the above prior art, it appears that the possibility of generating a silicon oxide of good quality still comes up at the present time against essentially two problems:

the quality of the surfaces of wafers, layers or films of germanium or SiGe alloys having a very high Ge concentration is degraded when they are heat treated in an oxidizing atmosphere, and not only is $SiO_2$ formed but also germanium oxide, which is known for its instability;

during heat treatment of wafers, layers or films of silicon-germanium in an oxidizing atmosphere, the aim is to cause the silicon located near the surface to oxidize. If it is managed to obtain an oxide free of germanium, thereby avoiding the abovementioned problems associated with the formation of germanium oxide, this can be explained in particular by migration of the germanium, which results in an uncontrolled increase in the germanium concentration "ahead" of the oxidation front. The uncontrolled germanium concentration gradient thus obtained ahead of the oxidation front is unacceptable for most of the intended subsequent applications such as, for example, in high-frequency microelectronics.

There is therefore a need for a method of preparing a silicon oxide layer by high-temperature oxidation on a germanium or silicon-germanium alloy substrate, which does not have the drawbacks, defects, limitations and disadvantages of the methods of the prior art.

In particular, there is a need for a method of preparing a silicon oxide layer by high-temperature oxidation on a germanium or silicon-germanium alloy substrate that avoids the formation of unstable germanium oxide and that also, depending on the intended application, avoids or controls the migration of germanium, the segregation of germanium and the appearance of germanium concentration gradients in the vicinity of the interface between the $SiO_2$ and the substrate, for example an $Si_{1-x}Ge_x$ substrate.

In general, there is a need for such a method that ensures formation of an $SiO_2$/substrate (for example an $Si_{1-x}Ge_x$) of excellent quality.

This need and also others are met, in accordance with the invention, by a method of preparing a silicon dioxide layer by high-temperature oxidation on a substrate of formula $Si_{1-x}Ge_x$ in which x is greater than 0 and less than or equal to 1, the said method comprising the following successive steps:

a) at least one additional layer of thickness $h_y$ and of overall formula $Si_{1-y}Ge_y$, in which y is greater than 0 and less than x, is deposited on the said substrate of formula $Si_{1-x}Ge_x$; and b) the high-temperature oxidation of the said additional layer of overall formula $Si_{1-y}Ge_y$ is carried out, whereby the said additional layer is completely or partly converted into a layer of silicon oxide $SiO_2$.

The term "high-temperature oxidation" is intended in general to mean that the oxidation is carried out at a temperature high enough to cause oxidation of the additional layer(s) and of the optional complementary layer (see below) essentially through the action of thermal energy. This temperature is generally greater than or equal to 400° C.

The method of the invention is essentially characterized in that at least one additional layer of thickness $h_y$ and of overall formula $Si_{1-y}Ge_y$ is deposited on the surface of the substrate of formula $Si_{1-x}Ge_x$. The term "overall formula" is understood to mean the average formula presented by the layer by adopting the average value of y for the entire layer, the average value being obtained from the various values of y that are measured for example at various thicknesses.

Such a step of depositing an additional $Si_{1-y}Ge_y$ layer is neither described nor suggested in the prior art.

Thus, in document US-B1-6 352 942, a layer that may be termed an "additional layer" is deposited, but this is a silicon layer and not a silicon germanium alloy of particular composition.

Step b) of the method according to the invention may be defined as a step of producing an additional, sacrificial and specific, film of silicon-germanium alloy of formula $Si_{1-y}Ge_y$.

This layer is an additional layer as regards most of the methods of the prior art in which the structure to be oxidized terminates at the surface with a material, whether it be a substrate or a film, of composition $Si_{1-x}Ge_x$.

This layer is a specific layer as its composition, defined by y, and its initial thickness ($h_y$) are chosen according to the substrate, or support, on which it is produced, in order to obtain a specific and controlled germanium concentration upstream of the $SiO_2$ layer.

This layer is sacrificial in the sense that it will serve, over all or part of its thickness, for the generation of the silicon oxide.

The method according to the invention, thanks essentially to the deposition of the additional layer in step b), does not have the drawbacks, defects, limitations and disadvantages of the methods of the prior art and it solves the problems of the methods of the prior art.

In particular, according to the invention, what is obtained after the oxidation of the additional layer is a high-quality interface between, on the one hand, the $Si_{1-x}Ge_x$ or the $Si_{1-z}Ge_z$ formed in the $Si_{1-y}Ge_y$ layer (see below) and, on the other hand, the silicon oxide formed.

Furthermore, it is also possible, by a suitable choice of the additional $Si_{1-y}Ge_y$ layer, to obtain a germanium concentration, in the vicinity of the interface with the silicon oxide, that is substantially constant, with no segregation of the germanium and without increasing its concentration near the interface. What is therefore obtained on the surface of the substrate is $Si_{1-x}Ge_x$ provided with a layer of $SiO_2$. To do this, an $Si_{1-y}Ge_y$ additional layer is deposited, y being chosen in such a way that after oxidation, part of this additional layer is consumed, the rest of the layer being converted to $Si_{1-x}Ge_x$.

In contrast, it is possible, if so desired, again by choosing a suitable additional layer, to obtain a controlled germanium concentration, different from x, upstream of the oxide (that is to say in an $Si_{1-x}Ge_x$ layer between the $Si_{1-x}Ge_x$ and the oxide layer, it being possible for z to be less than or greater than x, depending on the case) while still perfectly controlling the thickness of the oxide created.

In other words, following the oxidation:
either $Si_{1-y}Ge_y$ is completely oxidized: there is then an $SiO_2$ layer on the $Si_{1-x}Ge_x$, the composition of which has a controlled Ge front (there is then an $Si_{1-x'}Ge_{x'}$ layer where x'>x on the surface of $Si_{1-x}Ge_x$);
or $Si_{1-y}Ge_y$ is partly oxidized: there is then an $SiO_2$ layer on $Si_{1-z}Ge_z$ on $Si_{1-x}Ge_x$, with z>y and it is advantageous to ensure that z=x.

Moreover, the oxide formed by the method of the invention is a simple silicon oxide free of germanium oxide and not a mixed oxide.

Therefore, advantageously, y and/or $h_y$ are chosen so as to control, after the oxidation, the germanium concentration of the SiGe alloy layer lying below the silicon oxide layer.

Advantageously, the composition of the additional layer defined by y and/or the thickness $h_y$ is(are) chosen according to the $Si_{1-x}Ge_x$ substrate and/or according to the thickness of the layer of silicon oxide $SiO_2$ and/or the germanium concentration of the silicon-germanium alloy layer that is immediately below the silicon oxide layer.

Advantageously, the composition of the additional layer defined by y and/or the thickness $h_y$ is(are) chosen so as to limit the stresses generated by the difference in crystal lattice parameters between $Si_{1-x}Ge_x$ and $Si_{1-y}Ge_y$.

Advantageously, during step b), the said additional layer is partly converted into silicon oxide in order to give a silicon oxide layer on a layer of formula $Si_{1-x}Ge_z$ and of a thickness $h_z$.

Advantageously, z is substantially equal to x.

The additional layer may be a graded composition layer in which the germanium concentration varies continuously, preferably continuously decreases from the substrate.

Several additional layers may be deposited, which differ in their value of y, the value of y preferably decreasing from the additional layer located near the substrate as far as the layer located at the thickness $h_y$.

It is furthermore possible to deposit a complementary layer of SiGe on the said at least one additional layer, the said complementary layer also being completely converted into a layer of silicon oxide $SiO_2$.

Alternatively, it is also possible to deposit a complementary $SiO_2$ layer on the said at least one additional layer.

The oxidation is generally an oxidation by oxidizing heat treatment carried out dry and/or wet.

The set of advantageous properties exhibited at the end of the method by the substrate provided with its $SiO_2$ layer makes it easier to be used in all envisaged applications such as, for example, high-frequency microelectronics or else the production of SiGeOI or GOI (SiGe on Insulator or Ge on Insulator respectively) substrates.

The invention also relates to a method of preparing optical or electronic components (for example MOSFETs) comprising at least one step in which an $SiO_2$ layer is prepared by the method as defined above.

The invention relates to a method of preparing an $Si_{1-x}Ge_xOI$ structure in which, in a first embodiment, a structure comprising an $Si_{1-x}Ge_x$ film covered with a layer of silicon oxide $SiO_2$ is prepared by the method according to the invention described above, a layer located within the $Si_{1-x}Ge_x$ film is weakened, before or after step b), for example by the implantation of gaseous species, this structure comprising the weakened layer is joined to a substrate, for example a silicon substrate, in order to obtain an assembly comprising the substrate and the structure, and this assembly is separated at the weakened layer by a heat and/or mechanical treatment.

The invention relates to a method of preparing an $Si_{1-x}Ge_xOI$ structure in which, in a second embodiment, a structure comprising an $Si_{1-x}Ge_x$ film covered with a layer of silicon oxide $SiO_2$ is prepared by the method according to the invention described above, this structure is joined to a substrate, in order to obtain an assembly comprising the substrate and the structure, and this assembly is mechanically and/or chemically thinned.

The invention will now be described in detail in the description that follows, together with the appended drawings in which.

Figure 3A:
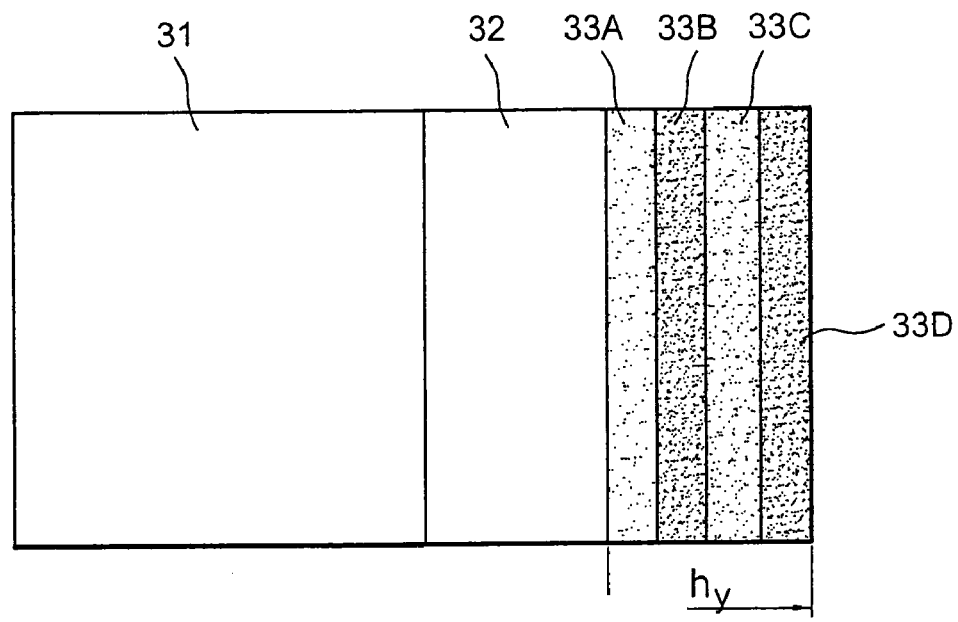
Figure 3B:
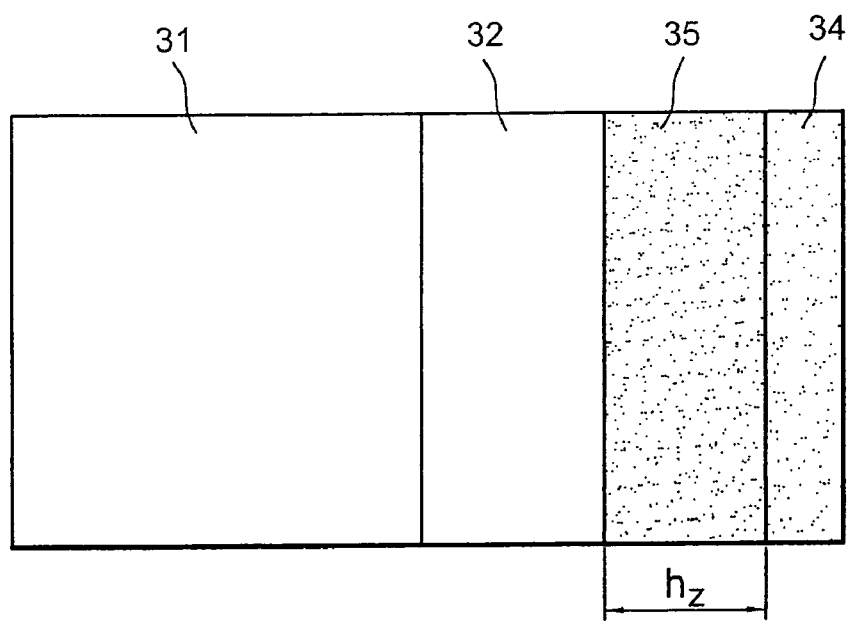
Figure 4A:
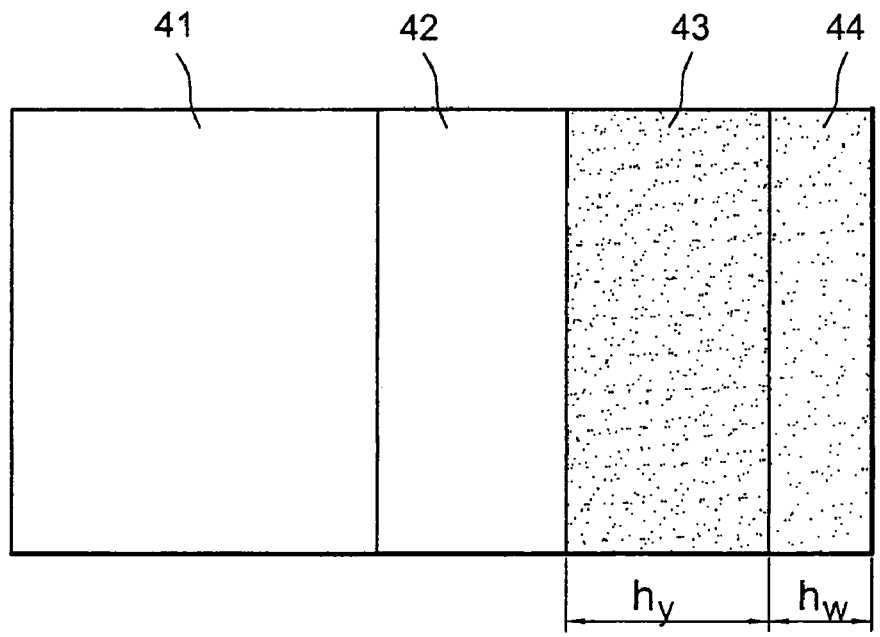
Figure 4B:
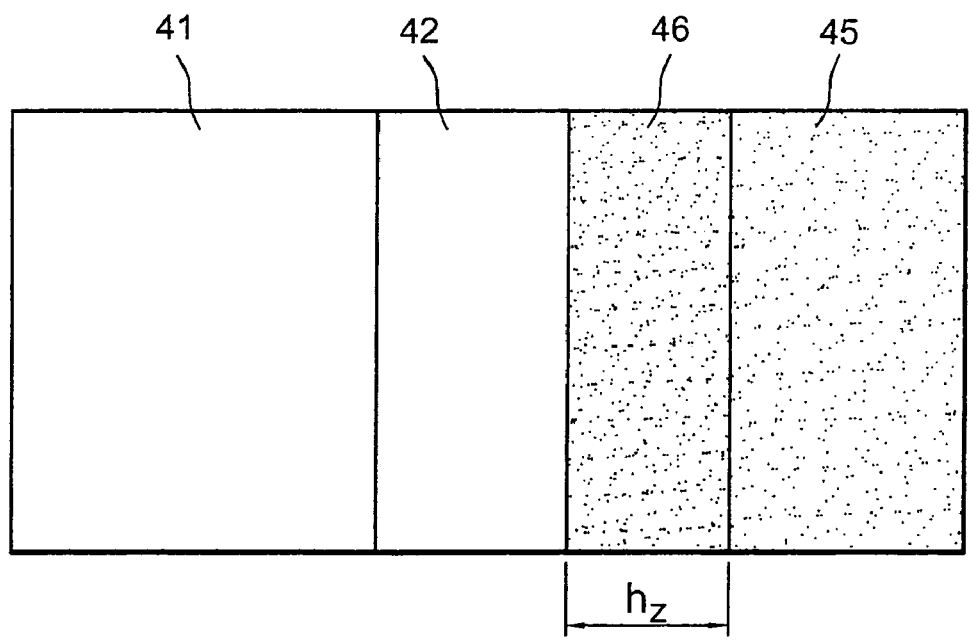

FIGS. 3A and 3B illustrate a third way of implementing the method according to the invention, in which several additional layers or films possessing the formulae $Si_{1-y}Ge_y$, with various values of y, are deposited on the substrate, and these layers provide, by oxidation, a Ge-enriched film of formula $Si_{1-z}Ge_z$ and an $SiO_2$ film; and FIGS. 4A and 4B illustrate a fourth way of implementing the method according to the invention, in which a complementary layer or film, for example of formula $Si_{1-w}Ge_w$ is also deposited on the $Si_{1-y}Ge_y$ additional film; during the oxidation, a Ge-enriched film of formula $Si_{1-z}Ge_z$ is generated in the additional film and an $SiO_2$ oxide film is generated in the complementary and additional films.

The method of the invention is a method of preparing, by high-temperature oxidation, a silicon dioxide layer on a substrate, the said substrate satisfying the formula $Si_{1-x}Ge_x$.

The substrate according to the invention generally has an essentially plane surface on which the silicon dioxide layer is prepared.

The $Si_{1-x}Ge_x$ substrate may be a bulk substrate, especially if x=1, that is to say a bulk germanium substrate. Such a substrate generally is in the form of a disc typically with a thickness of between 300 and 900 µm.

The $Si_{1-x}Ge_x$ substrate may also preferably be in the form of a layer or film, preferably a single-crystal layer or film, $Si_{1-x}Ge_x$ (12, 22, 32, 42) generally from 5 nm to one or a few microns in thickness (for example 1, 2, 5 or 10 µm), which is itself deposited on a support (11, 21, 31, 41).

The support (11, 21, 31, 41) may be a support made of a single material (called single-material support), for example made of germanium or silicon, but it may be a composition support. This support may comprise a base substrate, for example made of silicon, on which one or more buffer matching layers, for example of SiGe, are produced by various technologies known to those skilled in this technical field.

The $Si_{1-x}Ge_x$ (substrate) layer or film (12, 22, 32, 42) is for example deposited on the support by epitaxy or CVD (chemical vapour deposition). It is generally a relaxed layer.

This layer generally has a thickness of one to a few nm (for example 1, 2 or 10 nm) to one or a few microns (for example 1, 2 or 10 µm) for example.

In the formula. $Si_{1-x}Ge_x$, x is greater than 0 and less than or equal to 1. This therefore means that the substrate may be made of germanium or of a silicon-germanium alloy, the germanium composition of which is strictly between 0 and 1. For example, it may be 0.3.

According to the method of the invention (step a)), at least one additional layer or film of overall formula $Si_{1-y}Ge_y$, of thickness $h_y$, in which y is greater than 0 and less than x, for example y may have a value of 0.25 if x=0.3, is deposited on the substrate of formula $Si_{1-x}Ge_x$.

As already indicated above, this additional layer is also a specific layer as its composition (y) and its initial thickness $h_y$ (before oxidation) are chosen according to the $Si_{1-x}Ge_x$ substrate on which it is produced and/or according to the oxide thickness to be formed and/or according to the Ge concentration upstream of this oxide that is desired to obtain. Advantageously, y will be chosen so as to obtain, after the oxidation, a germanium concentration equal to x near the oxide layer created.

In particular, during production of this additional layer or film, and insofar as it is desired, for example, to obtain this film with epitaxial quality, there may be an upper limiting thickness of the additional film to be respected. This is because the strains generated by the difference in the $Si_{1-x}Ge_x$ and $Si_{1-y}Ge_y$ crystal lattices may become too high for the additional layer or film, resulting in dislocations in the said additional layer.

Consequently, the thickness $h_y$ of the additional layer(s) is generally chosen so as to limit the strains generated by the difference in crystal lattices between $Si_{1-x}Ge_x$ and $Si_{1-y}Ge_y$. Furthermore, the initial thickness $h_y$ of the additional layer(s) is chosen so as to control the germanium concentration upstream of the oxide, that is to say the germanium concentration of the layer of silicon-germanium alloy lying immediately beneath the silicon oxide layer (this concentration may be equal to x or may have a higher or lower value, depending on the intended application).

The thickness $h_y$ of the layer or layers (the total thickness of the layers) is generally from one to a few nm, for example from 1 to 5 or 10 nm.

The additional layer(s) may be deposited by any method known to those skilled in this field of the art, for example a CVD (chemical vapour deposition) process, a preferred process is epitaxy via RPCVD (reduced-pressure chemical vapour deposition).

One additional layer may be deposited on the substrate or several additional layers.

In FIGS. 1A to 4A and 1B to 4B the substrate comprises a support (11, 21, 31, 41) (a single-material, for example a Ge support, or a composite support, for example Si with SiGe matching layers) and a relaxed $Si_{1-x}Ge_x$ layer (12, 22, 32, 42) with for example x=0.3, but of course this layer is given merely by way of illustration.

Figure 1A:
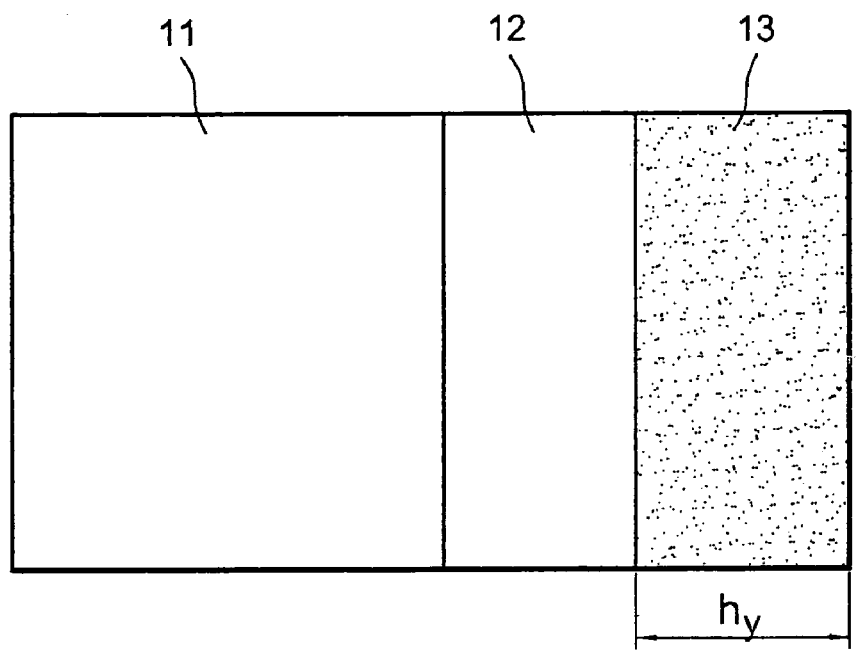
FIGS. 1A and 1B illustrate a first way of implementing the method according to the invention, in which an additional layer or film having the formula $Si_{1-y}Ge_y$ is deposited on the substrate, which layer or film provides, by oxidation, a Ge-enriched film of formula $Si_{1-z}Ge_z$ and an $SiO_2$ film.

In a first way of implementing the method according to the invention illustrated in FIG. 1A, a single additional layer (13), which generally has a thickness $h_y$ from 1 to a few nm, for example 2, 5, or 10 nm, is deposited, this layer (13) having a formula $Si_{1-y}Ge_y$, the value of y remaining constant for the entire thickness of the layer (13) and being as defined above, for example equal to 0.25 ($Si_{0.75}Ge_{0.25}$).

Figure 2A:
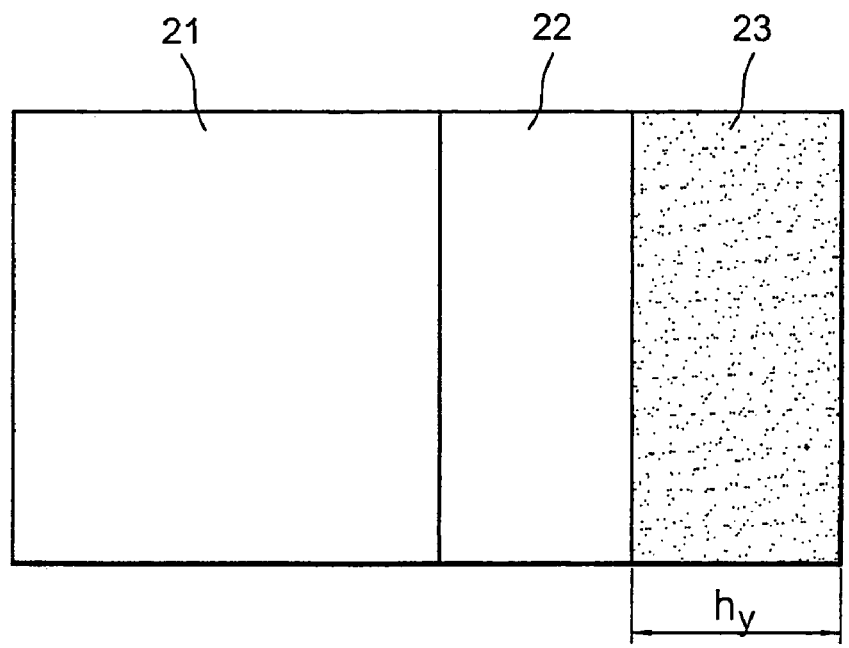
FIGS. 2A and 2B illustrate a second way of implementing the method according to the invention, in which an additional layer or film, which is an $Si_{1-grad\,y}Ge_{grad\,y}$ graded composition film, is deposited on the substrate, which layer or film provides, by oxidation, a Ge-enriched film of formula $Si_{1-grad\,z}Ge_{grad\,z}$ and an $SiO_2$ film.

In a second way of implementing the method according to the invention, illustrated in FIG. 2A, the additional layer or film (23) is a graded composition layer (23), in which the initial germanium concentration (y) varies continuously.

Preferably, this germanium concentration decreases continuously from the substrate and, moving away from the latter, is a minimum when the thickness $h_y$ is reached.

For example $y_0$, the value of y near the substrate, may be between 0.3 and 0.15 and $y_{h_y}$, the value of y at the thickness $h_y$, is between 0.25 and 0.05, $h_y$ possibly being between 1 and 10 nm.

This means that the germanium concentration gradient may for example be a gradient that decreases from the surface of the substrate at a rate of 1 to 10 per 1000 per nanometer.

The additional layer (23), in this second method of implementation, may therefore be defined by the formula $Si_{1-grad\,y} Ge_{grad\,y}$, in which grad y therefore varies continuously, for example from 0.3 (near the additional layer/$Si_{1-x}Ge_x$ layer interface) down to 0.15 (at the thickness $h_y$).

In a third way of implementing the invention, illustrated in FIG. 3A, several additional layers are deposited. Thus, in FIG. 3A, four additional layers (33A, 33B, 33C, 33D) are deposited, but this is merely one example.

The total thickness of these layers (33A, 33B, 33C, 33D) is equal to $h_y$, already defined above, and each layer may have a different thickness or may have the same thickness, this thickness generally being from 1 nanometer to a few tens of nanometers (for example 200 nm).

When there are several additional layers, these layers generally differ in their value of y. The value of y preferably decreases from the additional layer located near the substrate (the layer 33A forming the interface with the substrate 32) as far as the layer (the outermost layer 33D) located at the thickness $h_y$, from a y value of $y_0$, which is preferably from 0.1 to 0.5, for example 0.3, down to a y value of $y_{h_y}$, which is preferably from 0.01 to 0.3, for example 0.2.

Preferably, the value of y decreases by the same step or increment $\Delta_y$ between each additional layer among several additional layers.

In FIG. 3A, in which four additional layers have been deposited, y varies for example from 0.275 ($y_0$) for the layer 33A near the substrate down to 0.200 ($y_{h_y}$) for the outermost layer 33D, with a step or increment $\Delta_y$ of 0.25. The four layers will therefore have y values of 0.275, 0.250, 0.225 and 0.200.

In a fourth method of implementation, a layer called "complementary" layer is furthermore deposited on the additional layer or layers. Thus, in FIG. 4A, a complementary layer (44), with a thickness for example of $h_w$, has been deposited on the additional layer (43). The complementary layer may also be converted, completely, into a layer of silicon oxide $SiO_2$. As a variant, it may be directly an oxide ($SiO_2$), for example deposited by LPCVD.

This complementary layer is advantageous, for example in the case in which it is desired to obtain an oxide thickness greater than that which the critical thickness corresponding to the composition of the additional layer or layers permits. Advantageously, this layer may be made of SiGe, for example of formula $Si_{1-w}Ge_w$. This layer, which will be completely converted into an oxide layer, does not need to be of high crystal quality—it may be polycrystalline, amorphous or else single crystal with a high dislocation density.

Once the additional layer or layers and the optional complementary layer have been deposited on the $Si_{1-x}Ge_x$ substrate, the high-temperature oxidation of the said additional layer(s) of overall formula $Si_{1-y}Ge_y$ is carried out, whereby the said additional layer(s) and optionally the said optional complementary layer is(are) completely or partly converted into silicon oxide $SiO_2$, or more precisely into a layer of silicon oxide $SiO_2$.

The oxidation is carried out at a high temperature, as defined previously, typically above 400° C. The $SiO_2$ oxide formed is defined as "thermal" $SiO_2$ or silica.

The oxidation may be dry oxidation. In this case, the oxidation is generally carried out by bringing the additional layer(s) and the optional complementary layer into contact with a dry oxidizing gas, for example oxygen.

Alternatively, the oxidation may be wet oxidation, that is to say the additional layer and the optional complementary layer are brought into contact with a gas containing steam, such as a mixture of steam, hydrogen and oxygen.

Under the effect of the high-temperature oxidation, the additional layer of overall formula $Si_{1-y}Ge_y$ and of thickness $h_y$ is completely or partly converted into a layer of silicon oxide.

It should be noted that if a complementary layer is present, this will, if it is not already made of silicon oxide, be completely converted into silicon oxide.

Generally in step b) the additional layer, or the combination of the additional layer and the optional complementary layer, is only partly converted into silicon oxide in order to give, on the surface, a layer of silicon oxide $SiO_2$ lying on a layer of formula $Si_{1-z}Ge_z$ of thickness $h_z$, in which z is therefore the upstream germanium concentration of the oxide desired for the application. In some cases, z will advantageously tend towards x, and may even be substantially equal to x.

In other words, as the $SiO_2$ film or layer progressively formed on the surface of the additional film, the said layer being obtained by oxidation of the silicon contained in the $Si_{1-y}Ge_y$ layer, the composition becomes enriched with germanium in the rest of the additional film of thickness $h_z$, the composition of which, averaged over this thickness $h_z$, becomes $Si_{1-z}Ge_z$ with z greater than Y.

Figure 1B:
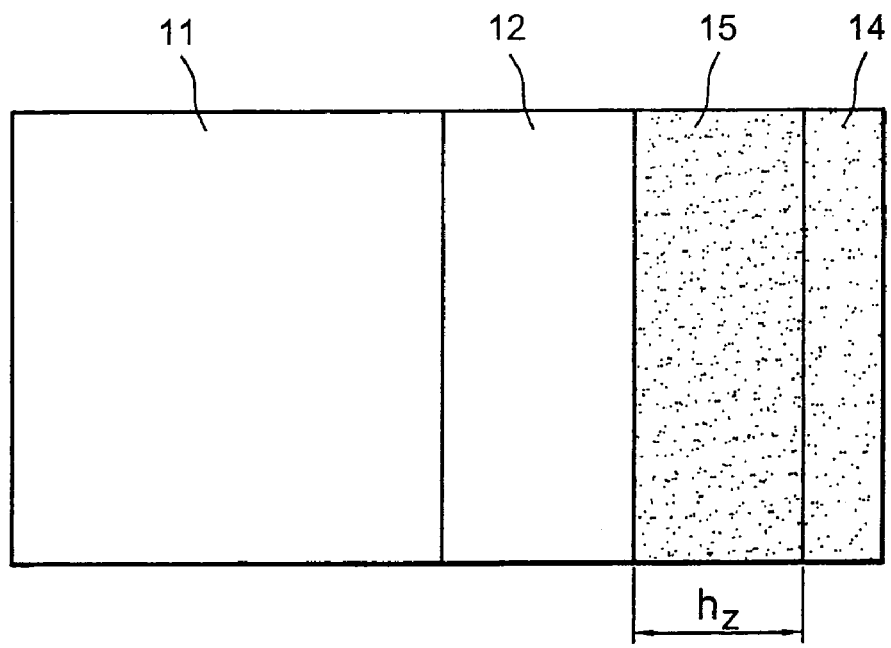

In the first way of implementing the method of the invention, as illustrated in FIG. 1B, the oxidation results in the formation of an $SiO_2$ layer (14) typically with a thickness of a few nanometers (for example 2, 5, or 10 nm) which is generated in the $Si_{1-y}Ge_y$ additional layer (13), and an $Si_{1-z}Ge_z$ layer (15) with a thickness $h_z$, which is enriched with Ge compared with the initial additional layer (13).

Figure 2B:
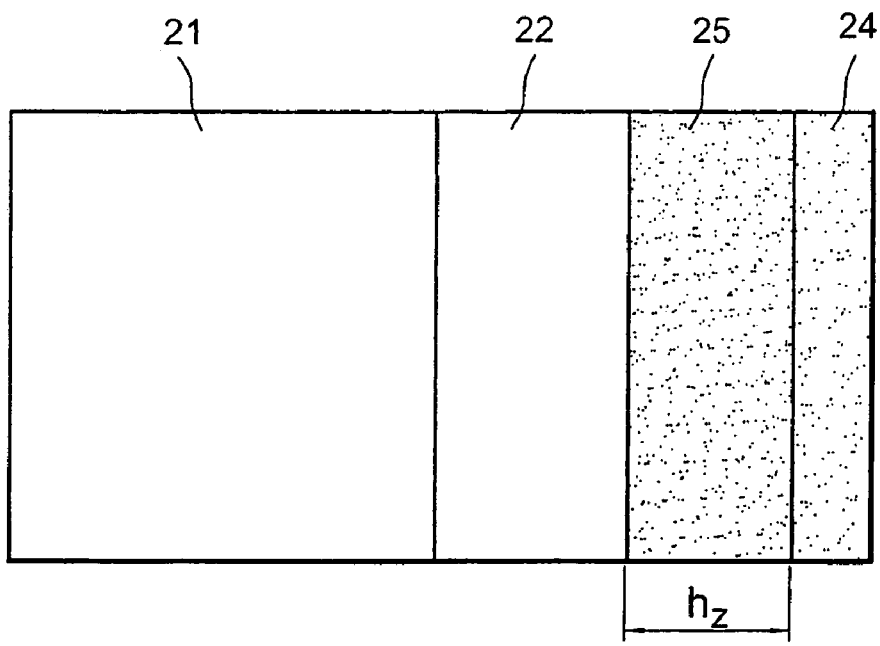

In the second way of implementing the method of the invention, as illustrated in FIG. 2B, the oxidation results in the formation of an $SiO_2$ layer (24), which is generated in the additional $Si_{1-grad\,y}Ge_{grad\,y}$ film or layer (23), and a layer (25) enriched with Ge compared with the initial additional layer (23).

In the third way of implementing the method according to the invention, as illustrated in FIG. 3B, the oxidation results in the formation of an $SiO_2$ layer (34), which is generated in the additional films (33A to 33D), and a region (35) enriched with Ge compared with the several initial additional layers (33A to 33D) (these numbering 4 in FIG. 3A).

In the fourth way of implementing the method of the invention, as illustrated in FIG. 4B, the oxidation results in the formation of an $SiO_2$ layer (45) which is generated in the complementary film (44) (namely in the entire complementary film) or which contains this complementary film, if it is made of $SiO_2$, and also generated in a portion of the additional film (43), and a layer (46) enriched with Ge compared with the initial additional layer (43).

The method according to the invention may be incorporated in a more general method, of which it therefore constitutes only one step.

For example, the method according to the invention may be used for film transfer, for example using the method described in U.S. Pat. No. 5,374,564 to the description of which the reader may refer.

A thermal oxide—the future buried oxide or BOx, of GeOI or SiGeOI-type structures is generated by the method of the invention.

The advantage offered by the method of the invention is therefore that of having an $Si_{1-x}Ge_x$/BOx interface of electronic quality and of having an $Si_{1-x}Ge_x$ layer whose germanium concentration, thanks to the method according to the invention, is as constant as possible in the region of this interface.

This structure (GeOI or SiGeOI) may be obtained from a structure obtained by the method of the invention, that is to say a structure having, on the surface, at least one SiGe or Ge film covered with a layer of oxide ($SiO_2$).

Care may be taken to create, in this structure, a buried weak zone in this SiGe or Ge film, for example by the implantation of gaseous species as described in U.S. Pat. No. 5,374,564, it being possible for the implantation to be carried out before or after the oxidation, or even before deposition of the additional layer.

The buried weak layer may thus be created in the $Si_xGe_{1-x}$ film or in the $Si_zGe_{1-z}$ film. This structure is then joined, using techniques known to those skilled in the art, by molecular bonding, to a final substrate, for example a silicon substrate that may or may not be surface oxidized. The structure thus obtained is then separated at the weakened zone by heat and/or mechanical treatment. The desired GeOI or SiGeOI structure is therefore obtained on both sides, a portion of the initial structure to be oxidized or the structure to be oxidized provided with a portion of the $Si_{1-z}Ge_z$ layer depending on the position of the buried weak zone.

Alternatively, instead of creating a buried weak zone, the structure obtained by the method of the invention may be directly bonded to the final substrate by molecular bonding, and then this structure may be thinned by mechanical and/or chemical means in order to obtain the desired GeOI or SiGeOI structure.

The invention will now be described with reference to the following examples, which are given by way of illustration but imply no limitation.

EXAMPLE 1

In this example, the implementation of the method according to the invention starts with the deposition of SiGe buffer layers using various technologies known from the prior art, for example CVD or RPCVD epitaxy, for example the continuous gradient technique for depositing, on a substrate, for example made of silicon (a 200 nm silicon "initial substrate), an $Si_{1-x}Ge_x$ layer whose concentration x varies continuously from 0 to the desired concentration at the surface.

Next, a relaxed $Si_{0.7}Ge_{0.3}$ film of 1 µm thickness is produced, for example by CVD or RPCVD epitaxy, on the stack of SiGe buffer layers. An approximately 65 nm sacrificial and specific additional film of $Si_{0.75}Ge_{0.25}$ (y=0.25) is then deposited on the $Si_{0.7}Ge_{0.3}$ film in accordance with the method of the invention, for example by CVD epitaxy.

Next, a heat treatment of the additional film, comprising, in particular, a dry oxidation using a dry $O_2$ with a flow rate of 8 l/min, and at a temperature of 900° C., is carried out.

The $SiO_2$ oxide is generated at the rate of 55 nm in 4 hours. The "consumption" of the additional layer, in order to form the oxide, is about 25 nm and the $Si_{1-z}Ge_z$ additional layer remaining has a thickness of about 40 nm.

The enrichment of this remaining additional layer with germanium is measured for example by SIMS and it is thus established that z equals about 0.37 for this layer.

EXAMPLE 2

This second example is a variant of the first, relating to the oxidation. In this example, the same structure as previously undergoes a wet oxidation by steam, $H_2$, with a flow rate of 8 l/min, and $O_2$, with a flow rate of 4 l/min, at a temperature of 900° C.

The $SiO_2$ oxide is generated in this case at a rate of 76 nm in 15 minutes. The "consumption" of the additional layer, in order to form the oxide, is about 35 nm and the $Si_{1-z}Ge_z$ additional layer remaining has a thickness of about 30 nm, with an enriched germanium concentration depending on the mechanism, as explained above.

The invention claimed is:

1. A method of preparing a silicon dioxide layer by high-temperature oxidation on a substrate of formula $Si_{1-x}Ge_x$ in which x is greater than 0 and less than or equal to 1, said method comprising the following successive steps:
   a) at least one additional layer of thickness $h_y$ and of overall formula $Si_{1-y}Ge_y$, in which y is greater than 0 and less than x, is deposited on said substrate of formula $Si_{1-x}Ge_x$; and
   b) the high-temperature oxidation of said additional layer of overall formula $Si_{1-y}Ge_y$ is carried out, whereby said additional layer is completely or partially converted into a layer of silicon oxide $SiO_2$.

2. The method according to claim 1, in which the substrate is composed of a, preferably single-crystal, $Si_{1-x}Ge_x$ layer on a support, the support being made of a single material, such as germanium or silicon, or comprising a base substrate, for example made of Si, on which one or more buffer matching layer(s), for example made of SiGe, is(are) produced.

3. The method according to claim 1, in which y and/or $h_y$ are chosen so as to control, after the oxidation, the germanium concentration of the SiGe alloy layer lying below the silicon oxide layer.

4. The method according to claim 1, in which the composition of the additional layer defined by y and/or the thickness $h_y$ is(are) chosen according to the $Si_{1-x}Ge_x$ substrate and/or according to the thickness of the layer of silicon oxide $SiO_2$ and/or the germanium concentration of the silicon-germanium alloy layer lying immediately below the silicon oxide layer.

5. The method according to claim 1, in which the composition of the additional layer defined by y and/or the thickness $h_y$ is(are) chosen so as to limit the stresses generated by the difference in crystal lattice parameters between $Si_{1-x}Ge_x$ and $Si_{1-y}Ge_y$.

6. The method according to claim 1, in which during step b), the said additional layer is partly converted into silicon oxide in order to give a silicon oxide layer on a layer of formula $Si_{1-z}Ge_z$ and of a thickness $h_z$.

7. The method according to claim 6, in which z is substantially equal to x.

8. The method according to claim 1, in which the said additional layer is a graded composition layer in which the germanium concentration varies continuously, preferably continuously decreases from the substrate.

9. The method according to claim 1, in which several additional layers are deposited, which differ in their value of y.

10. The method according to claim 9, in which the value of y decreases from the additional layer located near the substrate as far as the layer located at the thickness $h_y$.

11. The method according to claim 1, in which a complementary layer of SiGe is also deposited on the said at least one additional layer, the said complementary layer also being completely converted into a layer of silicon oxide $SiO_2$.

12. The method according to claim 1, in which a complementary $SiO_2$ layer is also deposited on the said at least one additional layer.

13. The method according to claim 1, in which the oxidation is an oxidation by oxidizing heat treatment carried out dry and/or wet.

14. A method of preparing an optical or electronic component, comprising at least one step in which a layer of silicon dioxide is prepared by the method according to claim 1.

15. A method of preparing an $Si_{1-x}Ge_xOI$ structure in which a structure comprising an $Si_{1-x}Ge_x$ film covered with a layer of silicon oxide $SiO_2$ is prepared by the method according to claim 1, a layer located within the $Si_{1-x}Ge_x$ film is weakened, before or after step b), for example by the implantation of gaseous species, this structure comprising the weakened layer is joined to a substrate, for example a silicon substrate, in order to obtain an assembly comprising the substrate and the structure, and this assembly is separated at the weakened layer by a heat and/or mechanical treatment.

16. A method of preparing an $Si_{1-x}Ge_xOI$ structure in which a structure comprising an $Si_{1-x}Ge_x$ film covered with a layer of silicon oxide $SiO_2$ is prepared by the method according to claim 1, this structure is joined to a substrate, in order to obtain an assembly comprising the substrate and the structure, and this assembly is mechanically and/or chemically thinned.

\* \* \* \* \*